United States Patent
Park et al.

(10) Patent No.: US 7,091,072 B2
(45) Date of Patent: Aug. 15, 2006

(54) SEMICONDUCTOR DEVICE AND METHOD FOR MANUFACTURING THE SAME

(75) Inventors: Yong-jik Park, Kyungki-do (KR); Ji-Young Kim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/971,353

(22) Filed: Oct. 22, 2004

(65) Prior Publication Data

US 2005/0064640 A1    Mar. 24, 2005

Related U.S. Application Data

(62) Division of application No. 10/453,165, filed on Jun. 2, 2003, now abandoned.

(30) Foreign Application Priority Data

Jun. 18, 2002    (KR) .............................. 2002-34150

(51) Int. Cl.
  *H01L 21/00*   (2006.01)
  *H01L 21/84*   (2006.01)
(52) U.S. Cl. ..................... 438/151; 438/299; 438/301
(58) Field of Classification Search ................ 438/299, 438/301, 142, 149, 151
See application file for complete search history.

(56) References Cited

U.S. PATENT DOCUMENTS

| | | | |
|---|---|---|---|
| 4,523,213 A * | 6/1985 | Konaka et al. ............. | 257/347 |
| 4,885,618 A | 12/1989 | Schubert et al. ............ | 257/362 |
| 6,198,141 B1 | 3/2001 | Yamazaki et al. .......... | 257/404 |
| 6,300,655 B1 | 10/2001 | Ema et al. .................. | 257/306 |
| 6,365,445 B1 * | 4/2002 | Yu .............................. | 438/149 |
| 6,420,218 B1 * | 7/2002 | Yu .............................. | 438/142 |
| 6,541,863 B1 | 4/2003 | Horstmann et al. ......... | 257/753 |
| 6,621,101 B1 | 9/2003 | Yudasaka et al. ............ | 257/66 |
| 6,653,700 B1 * | 11/2003 | Chau et al. .................. | 257/412 |
| 2002/0034841 A1 * | 3/2002 | Lee ............................. | 438/149 |

\* cited by examiner

*Primary Examiner*—Matthew Smith
*Assistant Examiner*—John M. Parker
(74) *Attorney, Agent, or Firm*—Marger Johnson & McCollom, P.C.

(57) ABSTRACT

Provided are a semiconductor device and a method for manufacturing the semiconductor device. The semiconductor device includes an isolation insulating film, an epitaxial silicon layer, a junction blocking insulating film, a gate stack, and source and drain junctions. The isolation insulating film is formed on a semiconductor substrate to define an active area. The epitaxial silicon layer is formed in the active area of the semiconductor substrate and surrounded by the isolation insulating film. The junction blocking insulating film is formed in the epitaxial silicon layer. The gate stack is formed over the epitaxial silicon layer so that the junction blocking insulating film is buried under approximately the center of the gate stack. The source and drain junctions are formed adjacent the sidewalls of the gate stack. Accordingly, a short circuit between source/drain junctions in a bulk area caused by the unwanted diffusion of the junctions can be prevented.

23 Claims, 6 Drawing Sheets

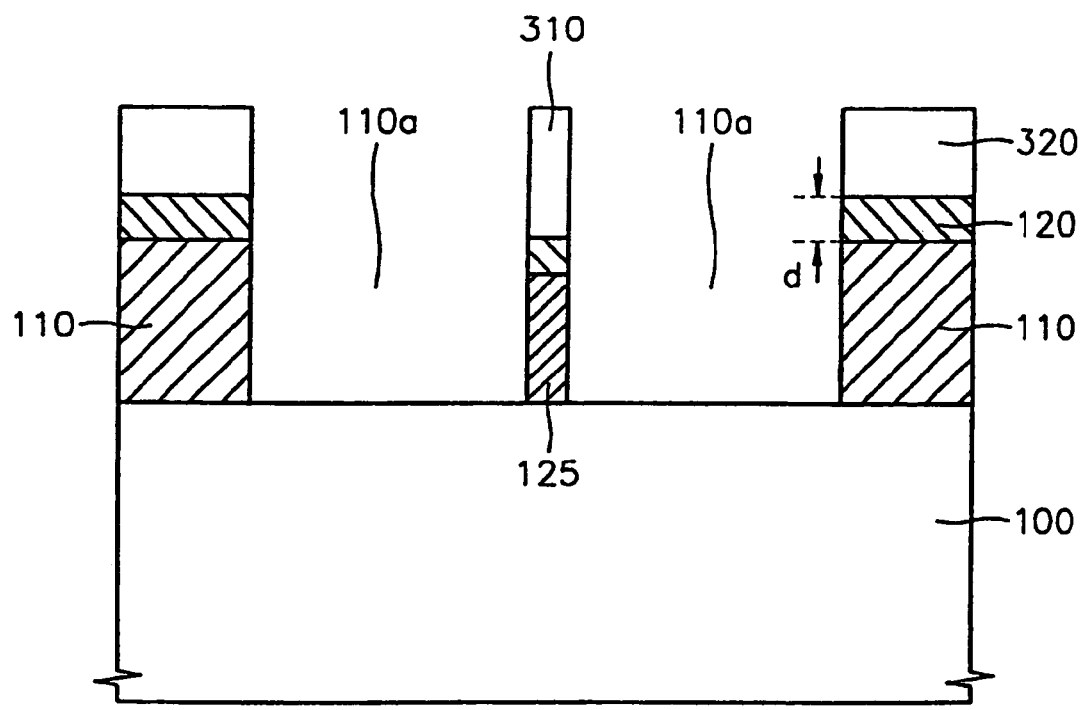
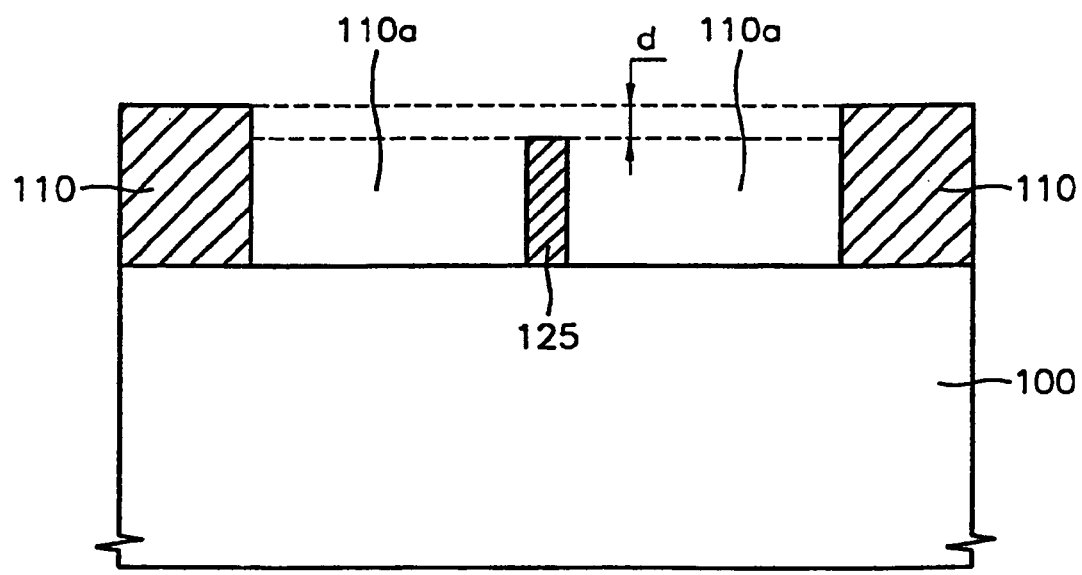

SEMICONDUCTOR DEVICE AND METHOD FOR MANUFACTURING THE SAME

This application is a Divisional of U.S. patent application Ser. No. 10/453,165, filed on Jun. 2, 2003 now abandoned, which is herein incorporated by reference in its entirety.

BACKGROUND OF THE INVENTION

1. Field of the Invention

The present invention relates to semiconductor devices and methods for manufacturing the same, and more particularly, to semiconductor devices formed using selective epitaxial silicon growth and methods for manufacturing the same.

2. Description of the Related Art

As the density of semiconductor devices has significantly increased, the design rule has also been reduced, resulting in a decrease in size of semiconductor devices. As a result, many problems occur when devices such as transistors are formed. For example, gates have to have a minimal acceptable length in negative-channel metal oxide semiconductor (NMOS) transistors of a cell area, and in positive-channel metal oxide semiconductor (PMOS) transistors and NMOS transistors of a peripheral area such that the NMOS and PMOS transistors can secure proper device characteristics. However, with the scaling of semiconductor devices, the NMOS and PMOS transistors cannot properly perform their functions due to a short circuit between junctions in a bulk region.

In order to solve these problems, methods of increasing actual gate lengths of transistors have been studied, such as the formation of shallow source/drain junctions.

However, even with the shallow source/drain junctions, because semiconductor devices need to be more scaled, the design rule is likewise reduced. For these reasons, because the distances between source regions and drain regions become reduced to less than the critical value, if a process of forming junctions inevitably accompanies a thermal diffusion process, impurity ions laterally diffuse, thus extending junction areas. Accordingly, in the prior art, because the distances between source and drain regions become too short, source and drain junctions can come in contact with each other, causing a short circuit between source/drain junctions in a bulk region.

SUMMARY OF THE INVENTION

Accordingly, the present invention provides a semiconductor device in which an NMOS transistor can achieve good electrical characteristics by efficiently preventing a short circuit between source and drain junctions in a bulk area, even when channels between the source and drain junctions are short due to the high integration of the semiconductor device, and a method for manufacturing the same.

According to an aspect of the present invention, there is provided a semiconductor device includes an isolation insulating film, an epitaxial silicon layer, a junction blocking insulating film, a gate stack, and source and drain junctions. The isolation insulating film is formed on a semiconductor substrate to define an active area. The epitaxial silicon layer is formed in the active area of the semiconductor substrate and surrounded or bounded by the isolation insulating film. The junction blocking insulating film is formed in the epitaxial silicon layer. The gate stack is formed over the epitaxial silicon layer so that the junction blocking insulating film is disposed or buried under approximately the center of the gate stack. The source and drain junctions are formed adjacent the sidewalls of the gate stack.

The gate stack includes a gate dielectric layer which is formed on the epitaxial silicon layer, a gate conductive layer which is formed on the gate dielectric layer so that the junction blocking insulating film is disposed under the gate stack and in approximately the center of the epitaxial silicon layer, and insulating spacers which are formed on the sidewalls of the gate conductive layer.

According to another aspect of the present invention, there is provided a method of manufacturing a semiconductor device having the above-described structure. An isolation insulating film is formed on a semiconductor substrate. The isolation insulating film is removed to a predetermined depth. A mask insulating layer is formed on the isolation insulating film. The mask insulating layer and the isolation insulating film are patterned, an isolation structure is formed, the active area is defined, and a junction blocking insulating film is formed in the active area. An epitaxial silicon layer is formed in the active area of the semiconductor substrate so that the junction blocking insulating film is buried in the eptaxial silicon layer. A gate stack is formed on the epitaxial silicon layer. Source and drain junctions are formed in the epitaxial silicon layer.

The isolation insulating film may be formed using chemical mechanical deposition or may be formed by oxidizing the semiconductor substrate.

A photoresist pattern that defines the active area is formed over the isolation insulating film. The isolation insulating film is dry etched to a predetermined depth using the photoresist pattern as a mask. The photoresist pattern is then removed. Thus, a predetermined step is formed between the active area and an isolation area. The predetermined step has to be formed to a minimum thickness so that a channel can be formed under the gate stack.

A mask insulating layer is formed on the isolation insulating film having the step is formed. Here, it is preferable that the mask insulating layer be formed of a material different than a material forming the isolation insulating film so that etch selectivity is easily changed when the mask insulating layer is removed.

A photoresist pattern is formed on the mask insulating layer. The mask insulating layer and the isolation insulating film are dry etched using the photoresist pattern as a mask. The photoresist pattern is then removed.

The isolation insulating layer remaining in the active area is removed. The epitaxial silicon layer is formed in the active area by selective epitaxial growth, using the substrate in the active area as a source and using the isolation insulating film and the junction blocking insulating film as masks. Here, the epitaxial silicon layer is grown thicker than the isolation insulating layer. A portion of the epitaxial silicon layer is removed using a planarization process so that the epitaxial silicon layer is planarized up to a top surface of the isolation insulating film. It is preferable that the planarization process is performed using chemical mechanical polishing and using the isolation insulating film as a polishing stopper, so that the epitaxial silicon layer is planarized to a proper thickness.

A gate dielectric layer is formed on the eptiaxial silicon layer. A gate conductive layer is formed on the gate dielectric layer. A gate pattern is formed on the gate conductive layer so that a portion of the epitaxial silicon layer on the junction blocking insulating film is disposed under approximately the center of the gate stack in the active area.

Preferably, after the gate pattern is formed, insulating spacers are formed on the sidewalls of the gate conductive layer so that after junctions are completed, a length of the gate becomes longer. As a result, a short channel effect can be prevented.

Junction ions are doped using the gate stack as a mask. The junction ions are diffused using a predetermined thermal process to form source and drain junctions. Here, the junction ions are one of P-type impurity and N-type impurity depending on the types of transistors. The P-type impurity is may be boron (B) or BF2. The N-type impurity is phosphorus (P), arsenic (As) or antimony.

As described above, in a semiconductor device and a method for manufacturing the semiconductor device, a junction blocking insulating film is formed on a channel connecting source and drain junctions disposed under a gate stack of a MOS transistor. Thus, since the junction blocking insulating film isolates the source and drains junctions, a design rule of the semiconductor device is reduced. As a result, although a distance between the source and drain junctions is reduced, a short circuit caused by the unwanted diffusion of junctions occurring when the semiconductor device operates can be efficiently prevented.

BRIEF DESCRIPTION OF THE DRAWINGS

The above object and advantages of the present invention will become more apparent by describing in detail preferred embodiments thereof with reference to the attached drawings, in which:

FIGS. 3 through 10 are cross-sectional views explaining various stages of manufacturing the semiconductor device according to an embodiment of the present invention.

DETAILED DESCRIPTION OF THE INVENTION

Hereinafter, preferred embodiments of the present invention will be described in detail with reference to the attached drawings. However, the preferred embodiments of the present invention may be modified into many different ways. The scope of the present invention is, therefore, not limited to the particular embodiments. Rather, the preferred embodiments herein are provided by way of example only.

Figure 1:
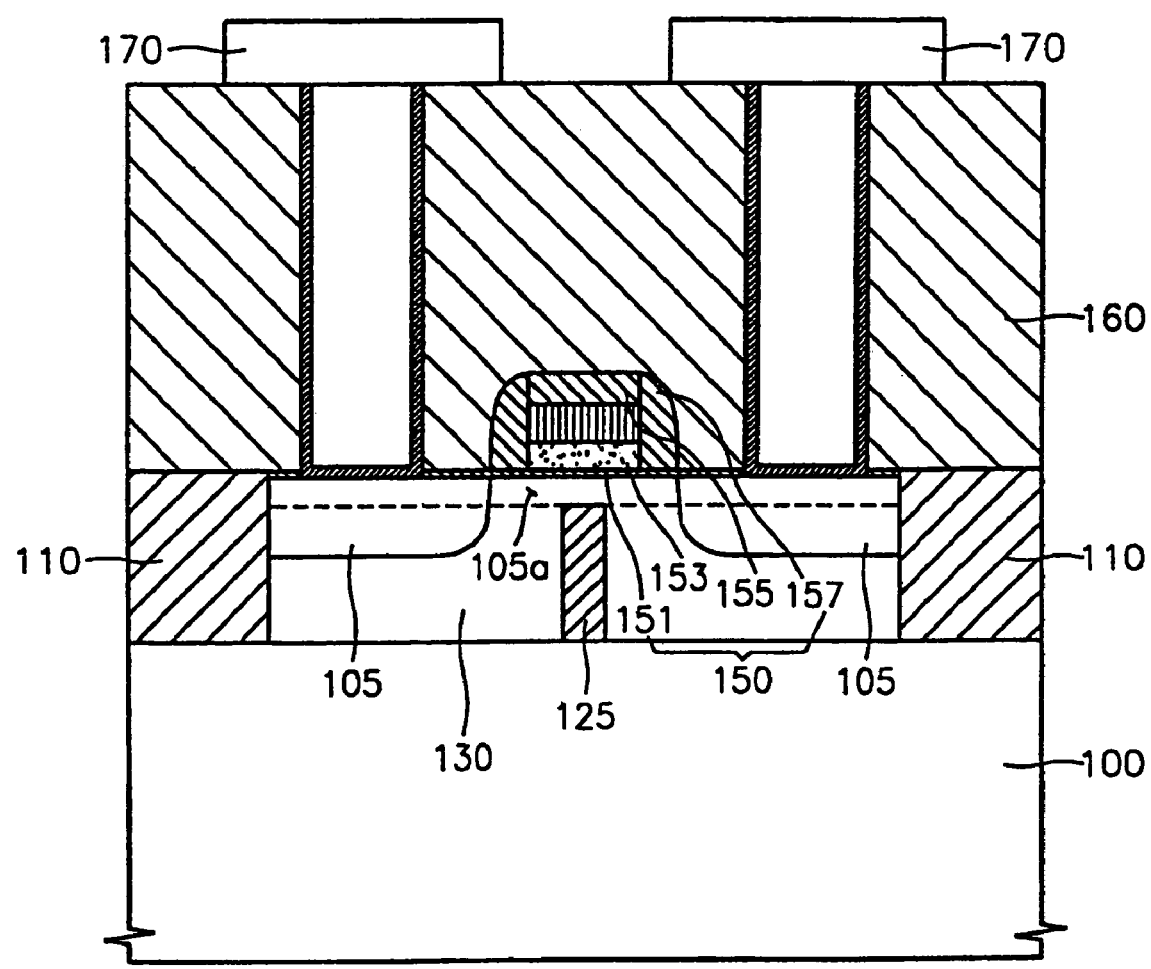
FIG. 1 is a cross-sectional view of a semiconductor device according to an embodiment of the present invention.

FIG. 1 is a cross-sectional view of a semiconductor device according to an embodiment of the present invention. Referring to FIG. 1, the semiconductor device according to the present invention includes an isolation insulating film 110, an epitaxial layer 130, a junction blocking insulating film 125, a gate stack 150, and source and drain junctions 105. The isolation insulating film 110 is formed on a semiconductor substrate 100 to a predetermined thickness and defines an active area in which devices will be formed. The epitaxial layer 130 is stacked on the semiconductor substrate 100 disposed in the area in which devices will be formed. The junction blocking insulating film 125 is buried in the epitaxial layer 130 and divides the active area into two regions for source and drain regions. The gate stack 150 is formed on top surface of the epitaxial layer 130 in which the junction blocking insulating film 125 is positioned at approximately the center of a channel. The source and drain junctions 105 are formed in the active area adjacent the sidewalls of the gate stack 150.

The isolation insulating film 110 is formed of a silicon insulator so as to protrude slightly higher than the semiconductor substrate 100. The silicon insulator may be a silicon oxide layer or a silicon nitride layer, which are formed using chemical vapor deposition (CVD). Since the silicon insulator is formed on the semiconductor substrate 100 in which devices are actually formed, it is preferable that the silicon insulator is formed using low-pressure chemical vapor deposition (LP-CVD) by which the concentration of contaminated impurities can be reduced. Preferably, the isolation insulating film is formed of a silicon oxide layer so that the semiconductor substrate 100 is under less stress. Because the layer characteristics of the isolation insulating film 110 is clear and hard, the isolation insulating film 110 may be a silicon oxide layer, which is formed by thermally oxidizing the semiconductor substrate 100.

The epitaxial layer 130 is preferably a single crystalline epitaxial silicon layer, which is selectively formed only on the semiconductor substrate 100 by CVD, using the isolation insulating film 110 as a mask.

The gate stack 150 includes a gate dielectric layer 151 formed on the epitaxial layer 130, a gate conductive layer 153 stacked on the gate dielectric layer 151, and a mask insulating layer 155 formed on the gate conductive layer 153. The gate dielectric layer 151 is a silicon oxide layer (SiO2) or a silicon oxynitride layer (SiON), which is formed by thermally oxidizing a surface of the epitaxial layer 130. The gate conductive layer 153 may include a doped polysilicon layer doped with impurity such as phosphorus (P) so as to be conductive and a metal silicide layer (not show) for increasing conductivity of the gate stack 150. The mask insulating layer 155 is formed of a silicon oxide layer or silicon nitride layer using CVD and serves to prevent plasma damage occurring when the gate stack 150 is patterned using dry etch. The mask insulating layer 155 also operates as an etch mask when patterning the gate stack 150. Since insulating spacers 157 are formed on the sidewalls of the gate conductive layer 153 and the mask insulating layer 155, an actual length of the gate stack 150 is extended, resulting in the prevention of a short channel effect.

The junction blocking insulating film 125 protrudes from a surface of the semiconductor substrate 100 and divides an active area that will be formed in the epitaxial layer 130 into two regions for source and drain regions. Like the isolation insulating layer 110, the junction blocking insulating film 125 is preferably formed of a silicon oxide layer or a silicon nitride layer. An upper portion of the junction blocking insulating film 125 is covered with a portion of the epitaxial layer 130, which is a portion of a channel 105a of the gate stack 150. The upper portion of the junction blocking insulating film 125 is disposed under approximately the center of the gate stack 150 to substantially completely isolate the source and drain junctions 105 from each other.

Reference numerals 160 and 170 denote an interlevel insulating layer and a metal interconnection layer, respectively. Here, if the semiconductor device is a semiconductor memory device, the semiconductor device further includes capacitors, and if the semiconductor device is a semiconductor logic device, the semiconductor device includes a plurality of metal interconnection layers.

Figure 2:
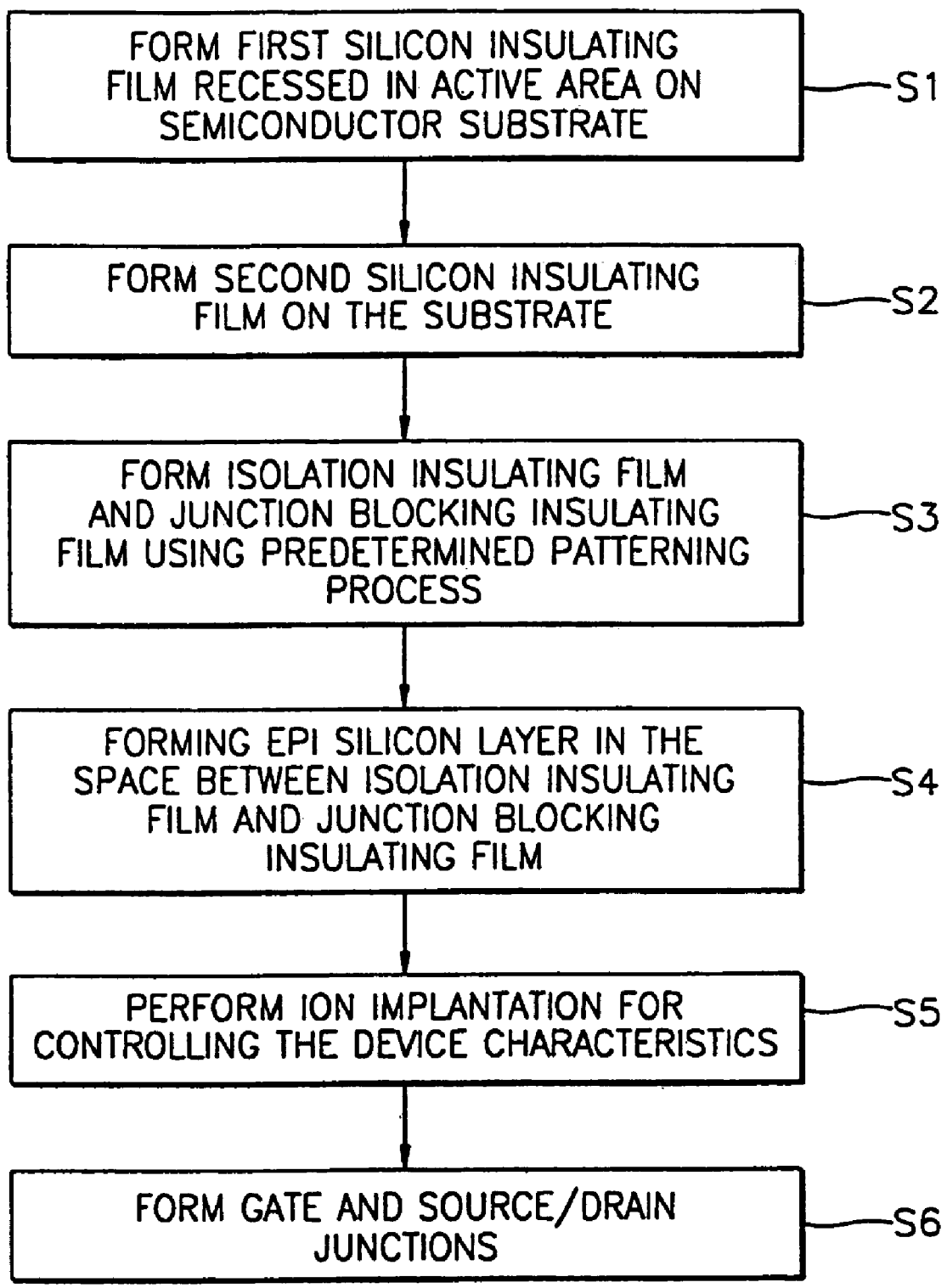
FIG. 2 is a flowchart schematically explaining a method for manufacturing the semiconductor device according to an embodiment of the present invention.

FIG. 2 is a flowchart explaining steps of manufacturing the semiconductor device of the present invention. FIGS. 3 through 9 are cross-sectional views explaining various stages of manufacturing the semiconductor device of the present invention. FIGS. 3 through 9 will be described with reference to the flowchart of FIG. 2.

Figure 3:
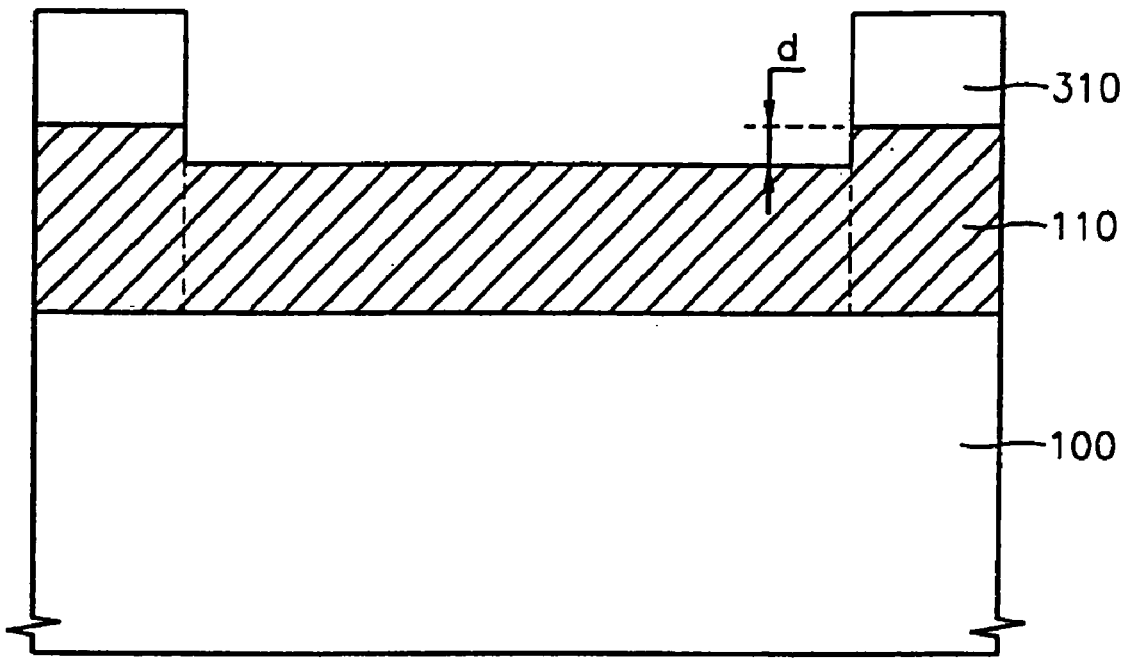

Referring to FIGS. 2 and 3, in step S1, a first silicon insulating film 110 (an isolation insulating film) is formed on a semiconductor substrate 100 and etched to a predetermined depth. For the sake of convenience, the same reference numeral is assigned to an isolation insulating film that will be formed later as to the first silicon insulating film, i.e., 110.

The first silicon insulating film 110 may be a silicon nitride film or a silicon oxide film, which are formed using, for example, CVD. Since the silicon oxide film is suitable for a deposition mask in selective epitaxial growth that will later be performed, the silicon oxide film is preferably deposited as the first silicon insulating film 110. The silicon oxide film may be formed by thermally oxidizing the semiconductor substrate 100. Since the silicon oxide film is hard, slowly etched in a cleaning solution, and clear, the silicon oxide film can help form a semiconductor device having good electrical characteristics.

The surface of the first silicon insulating film 110 is coated with a photoresist and then the photoresist is patterned using a predetermined photolithographic process to form a photoresist pattern 310 to define an active area. The first silicon insulating film 110 is dry etched by a thickness d using the photoresist pattern 310 as a mask. Then, a step having the thickness d is formed between the active area and an isolation area.

Figure 4:
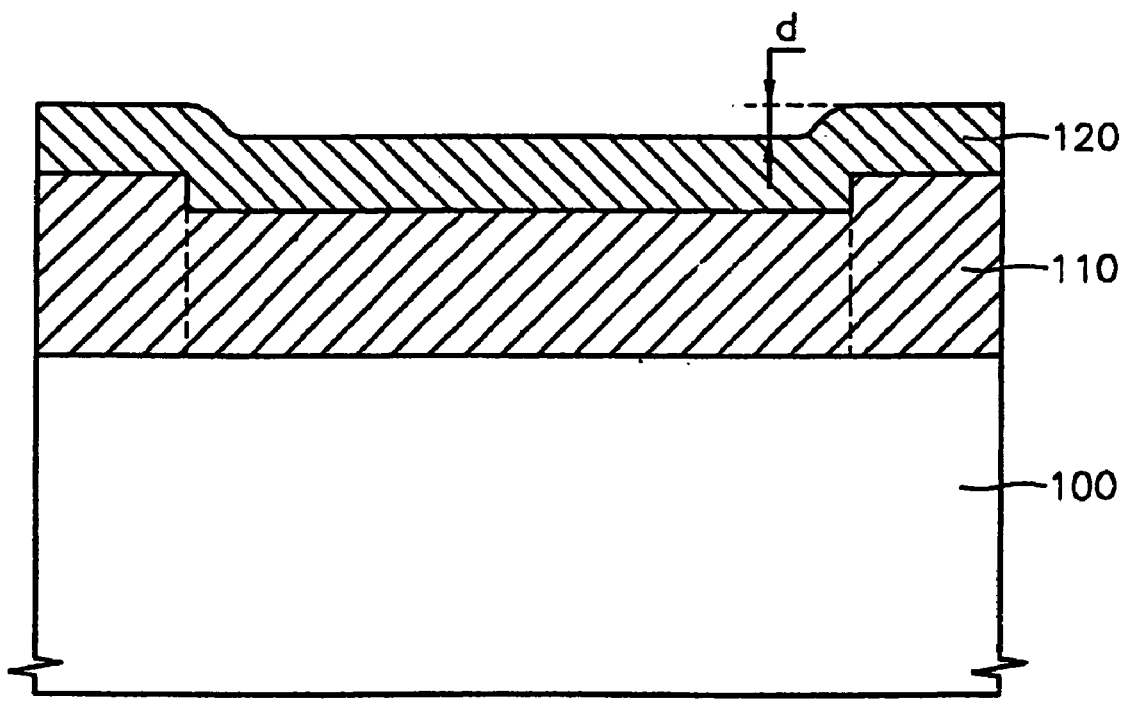

Referring to FIGS. 2 and 4, in step S2 the photoresist pattern 310 is removed, and a second silicon insulating film 120 (a mask insulating film) is formed on the surface of the semiconductor substrate 100. The step of the thickness d, which is formed due to the first silicon insulating film 110, remains between the active area and the isolation area, even after the second silicon insulating film 120 is formed. The second silicon insulating film 120 is preferably of a different type than the first silicon insulating film 110 to be suitable for a subsequent process requiring etch selectivity. In other words, when the first silicon insulating film 110 is a silicon oxide film, the second silicon insulating film 120 is preferably a silicon nitride film, or vice versa.

Referring to FIG. 5, the surface of the semiconductor substrate 100 is coated with photoresist 320, and then the photoresist 320 is patterned using photolithography form a hole exposing the active area and a junction blocking pattern in the photoresist 320. The second and first silicon insulating films 120 and 110 are sequentially dry etched, using the patterned photoresist 320 as a mask. Consequently, the second silicon insulating film 120 is formed the step d lower than the first silicon insulating film 110. As a result, predetermined spaces 110a are formed in the first and second silicon insulating films 110 and 120. The spaces 110a are used to selectively grow epitaxial silicon therein.

Referring to FIG. 6, the remaining photoresist 320 shown in FIG. 5 is removed using, for example, wet cleaning, and then portions of the second silicon insulating film 120 on the first silicon insulating film 110 are removed using a predetermined etching method. Then, in step S3, an isolation insulating film 110 protrudes from the semiconductor substrate 100 and concurrently, a junction blocking insulating film 125 having a step d toward the isolation insulating film 110 is formed.

The predetermined etching method is either dry etching using etching selectivity among films or wet etching using an etchant. In particular, it is preferable that if the second silicon insulating film 120 is a nitride film, the etchant used in the wet etching is a phosphoric acid solution (H3PO4), while if the second silicon insulating film 120 is a silicon oxide film, the etchant contains a hydrofluoric acid (HF) so that etch selectivity to silicon nitride or silicon oxide is good.

Figure 7:
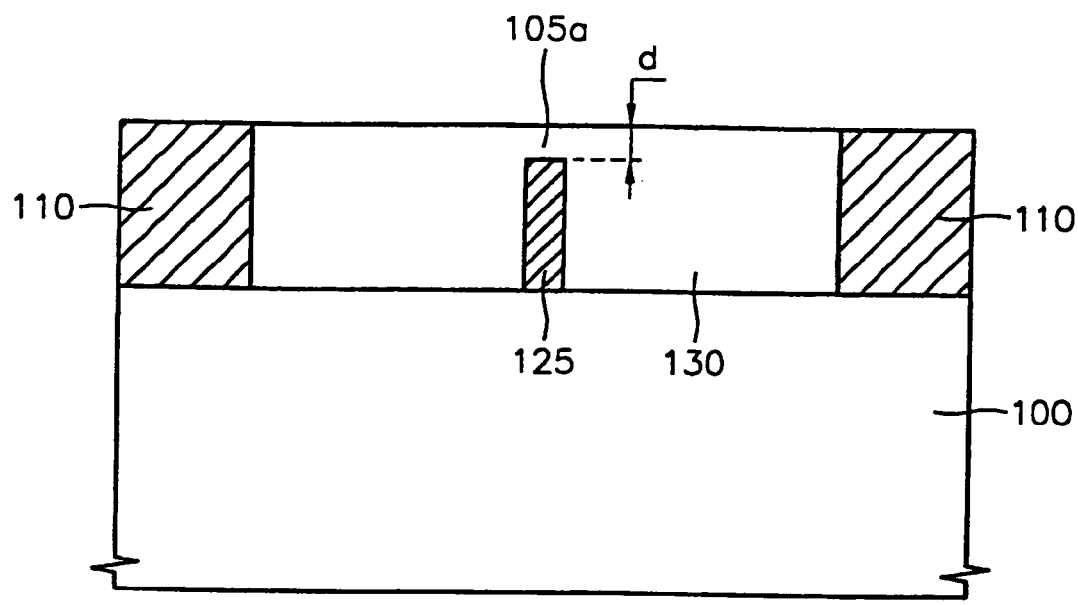

Referring to FIG. 7, in step S4, natural oxide and heavy metal remaining on the semiconductor substrate 100, a surface of which is exposed using a predetermined cleaning process, are removed, and then the spaces between the isolation insulating film 110 and the junction blocking insulating film 125 are filled with epitaxial silicon using the semiconductor substrate 100 as a growing source, thereby forming an epitaxial silicon layer 130. The epitaxial silicon overgrows and extends laterally, thereby forming a portion of the epitaxial silicon layer 130 on the junction blocking insulating film 125. As a result, the junction blocking insulating film 125 is buried in the epitaxial silicon layer 130 and the portion of the eptiaxital silicon layer 130 on the junction blocking insulating film 125 becomes a channel 105a of a gate stack (150 of FIG. 1) that will be formed later.

Here, in the wet cleaning, a cleaning solution containing HF (e.g., in a ratio of about 100:1 of H2O:HF or about 100:1 of NH4F:HF) may be used to remove the remaining oxide film or a standard cleaning (SC2) solution containing sulfuric acid (H2SO4) or hydrochloric acid (HCl) may be used to remove heavy metal contaminant. The natural oxide remaining on the semiconductor substrate 100 is completely removed and heavy metal adsorbed on the surface of the substrate is also completely removed. As a result, the surface of the substrate becomes clear.

By employing selective epitaxial growth (SEG) using CVD, epitaxial silicon grows using the substrate, the surface of which is exposed, as the growing source. In SEG, monocrystalline silicon grows in a portion in which a monocrystalline silicon source is exposed to form an epitaxial silicon layer, and a silicon film does not grow on a silicon insulating film. Thus, eptiaxial silicon grows only in portions where the substrate is exposed, i.e., spaces defined by the isolation insulating film 110 and the junction blocking insulating film 125. Here, for the SEG, a source gas may be DCS (SiH2Cl2), TCS(SiHCl3), SiCl4, or SiH4, and hydrogen (H2) is used as a carrier gas which carries a reaction gas and creates a reactive atmosphere. Also, the carrier gas contains hydrochloric acid (HCl) to have deposition selectivity so that epitaxial silicon grows only on monocrystals such as the semiconductor substrate 100.

The epitaxial silicon layer 130 is monocrystalline, and the first and second silicon insulating films 110 and 120 are amorphous. Therefore, when growing the epitaxial silicon layer 130, the boundary between the epitaxial silicon layer 130 and the first silicon insulating film 110 has different atomic structures. This could create facets (not shown) on the corners of the boundary. Thus, if epitaxial silicon grows higher than the isolation insulating film 110, and an overgrown portion of the epitaixal silicon is removed using a palanarization process. Consequently, the epitaxial silicon layer 130 having no facet defects can be formed. Preferably, the planarization process is performed by chemical mechanical polishing (CMP), if an upper portion of the isolation insulating film 110 is used as a polishing stopper, the epitaxial silicon layer 130 is filled up to a top surface of the isolation insulating film 110.

Figure 8:
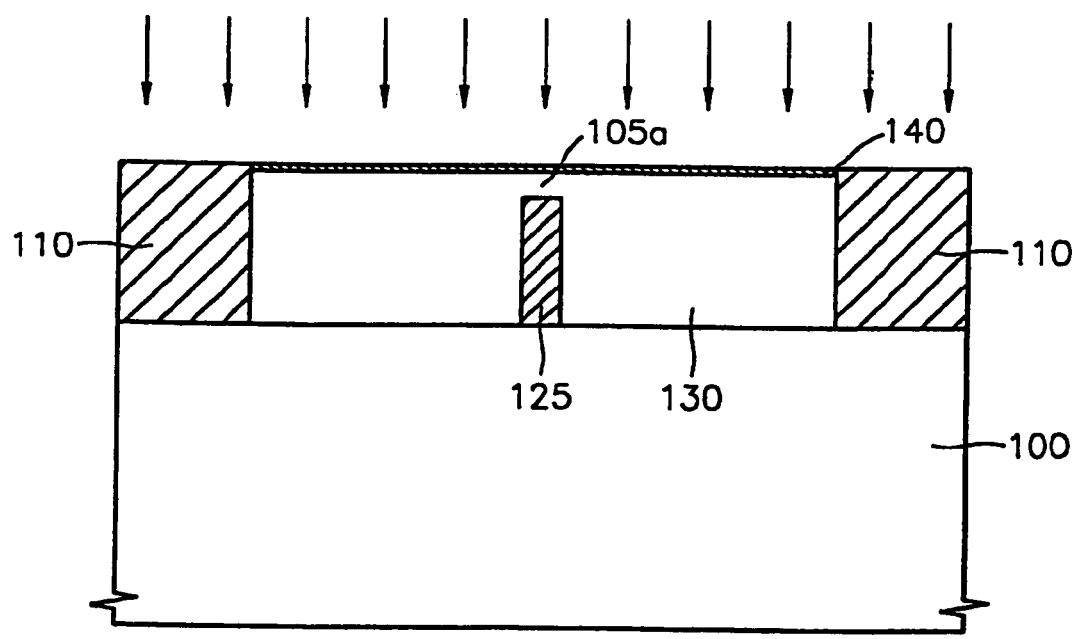

Referring to FIG. 8, in step S5, a pad oxide film 140 is formed on the epitaxial silicon layer 130, and then impurity ion implantation is performed on the resulting structure to control predetermined device characteristics. The pad oxide film 140 is preferably a silicon oxide film formed by thermally oxidizing the epitaxial silicon layer 130. This is because a silicon oxide film is useful for removing surface defects or impurities and can serve as a protective layer in the impurity ion implantation and prevent implanted impurities from diffusing out. Lightly doped drain channel ions or threshold voltage controlling ions are implanted.

Figure 9:
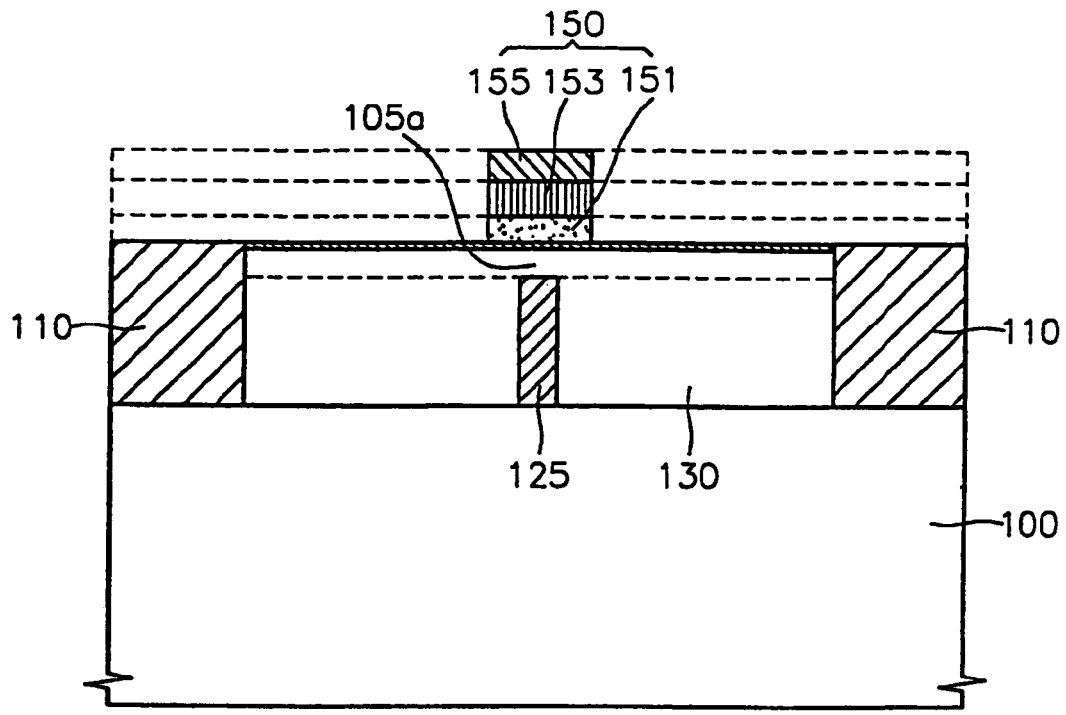

Referring to FIG. 9, in step S5, a gate dielectric layer 151, a gate conductive layer 153, and a mask insulating layer 155 are formed on the epitaxial silicon layer 130. Then, photolithographic and dry etching processes are performed to complete a gate pattern. The gate dielectric layer 151 is preferably a silicon oxide layer or a silicon oxynitride layer (SiON) formed by wet etching the pad oxide film 140 and then performing thermal oxidation on the exposed surface of the epitaxial silicon layer 130. The gate conductive layer 153 is formed of doped polysilicon using CVD or a combination of doped polysilicon and metal silicide. The mask insulating layer 155 may be formed of a silicon nitride layer if the mask insulating layer 155 is used as a mask necessary for forming a self-aligned contact, or the mask insulating layer 155 may be formed of a silicon oxide layer if the mask insulating layer 155 is simply used as a pattern mask.

Figure 10:
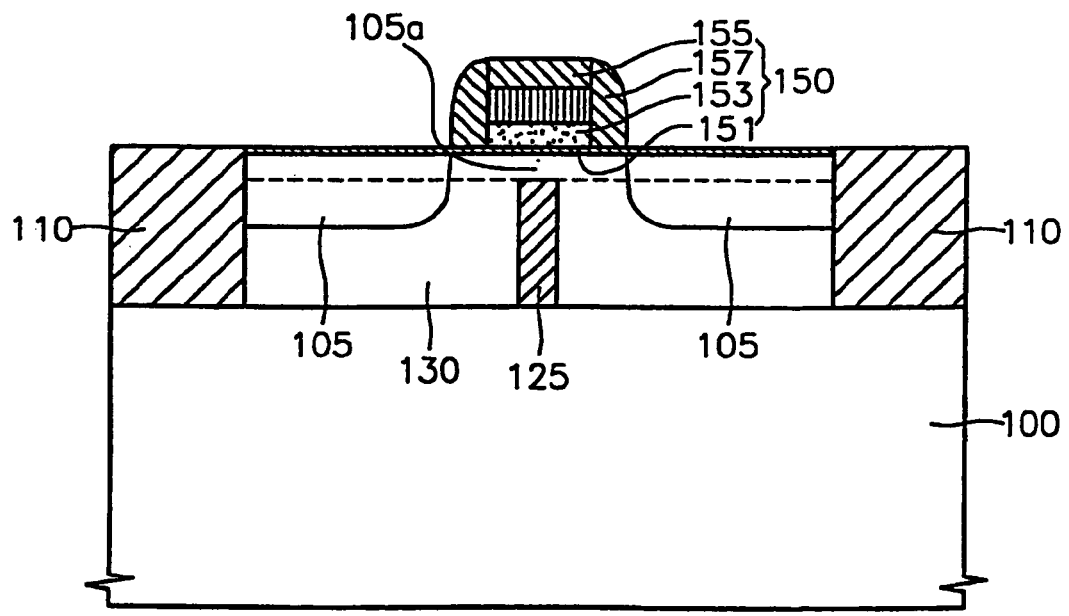

Referring to FIG. 10, in step S6, insulating spacers 157 are formed on the sidewalls of the patterned gate conductive layer 153 and mask insulating layer 155 to complete the gate stack 150, and source and drain junctions 105 are formed under both sidewalls of the gate stack 150.

In other words, a silicon insulating film is formed on the surface of the semiconductor substrate 100 using CVD and etched back using anisotropic dry etching, thereby forming insulating spacers 157 on the sidewalls of the gate conductive layer 153 and the mask insulating layer 155.

Junction ions are implanted into an active area opened adjacent the sidewalls of the gate stack 150, using an ion implantation method, and a predetermined annealing process is performed, thereby forming the source and drain junctions 105. In general, because a semiconductor device includes PMOS transistors and NMOS transistors, a predetermined photo process is performed to open corresponding areas, P-type impurity as junction ions is implanted into PMOS areas in which the PMOS transistors will be formed, and N-type impurity as junction ions is implanted into NMOS areas in which the NMOS transistors will be formed. Here, the P-type impurity is a ternary element such as boron (B), BF2, or the like while BF2, which can be highly concentrated, is suitable for junction ions. The N-type impurity is an element such as phosphorous (P), arsenic (As), antimony, or the like. It is preferable that the predetermined annealing process is a rapid thermal process (RTP), in which a process temperature rapidly rises and drops, to form shallow junctions. The source and drain junctions 105 are then formed under both sidewalls of the gate stack 150 and beside both sides of the junction blocking insulating film 125. Thus, since the junction blocking insulating film 125 blocks the extension of the source and drain junctions 105 due to heat and a potential difference, short-circuiting hardly occurs between the source and drain junctions 105.

Thereafter, other general semiconductor manufacturing processes are performed depending on the characteristics of a semiconductor device to complete the semiconductor device.

As described above, in a semiconductor device according to an embodiment of the present invention, a junction blocking insulating film 125 is interposed between source and drain junctions 105. Thus, although a design rule of the semiconductor device is extremely reduced and a distance between the source and drain junctions is shortened, a short circuit does not occur.

A semiconductor device and a method for manufacturing the same according to the present invention have the following advantages.

A junction blocking insulating film, which blocks a path to a bulk area, is formed between source and drain junctions. Thus, junction ions can be prevented from diffusing to the bulk area, which is due to a thermal process performed during a semiconductor manufacturing process or due to a threshold voltage applied when the semiconductor device operates. As a result, a short circuit can be prevented.

Also, because a channel is thinly formed on the source and drain junctions and on the junction blocking insulating film, the threshold voltage in the semiconductor device can be stably maintained with the prevention of the diffusion of ions in the channel to the bulk area.

Moreover, since an isolation insulating film and the junction blocking insulating film are formed at the same time, the number of process steps can be reduced. Furthermore, an epitaxial silicon layer, in which devices are formed, is surrounded or bounded by the isolation insulating film, and thus isolation among devices can be efficiently achieved.

Although various preferred embodiments of the present invention have been disclosed herein for illustrative purposes, those skilled in the art will appreciate that various modifications, additions, and substitutions are possible without departing from the scope and spirit of the invention as provided in the accompanying claims.

What is claimed is:

1. A method for manufacturing a semiconductor device, the method comprising:
    forming an isolation insulating film on a semiconductor substrate;
    removing a portion of the isolation insulating film to a predetermined depth;
    forming a mask insulating layer on the isolation insulating film;
    patterning the mask insulating layer and the isolation insulating film, to form an isolation structure that defines an active area and to form a junction blocking insulating film in the active area;
    forming an epitaxial silicon layer in the active area such that the junction blocking insulating film is buried in the epitaxial silicon layer;
    forming a gate stack on the epitaxial silicon layer; and
    forming source and drain junctions in the epitaxial silicon layer.

2. The method of claim 1, wherein the isolation insulating film is a silicon oxide film.

3. The method of claim 1, wherein the isolation insulating film is formed using chemical vapor deposition (CVD).

4. The method of claim 1, wherein the isolation insulating film is formed by oxidizing the semiconductor substrate.

5. The method of claim 1, wherein semoving the portion of the isolation insulating film comprises:
    forming a photoresist pattern that defines the active area over the isolation insulating film;
    dry etching the isolation insulating film to a predetermined depth using the photoresist pattern as a mask; and
    removing the photoresist pattern.

6. The method of claim 1, wherein in forming the mask insulating layer the mask insulating layer is formed of a material different than a material forming the isolation insulating film.

7. The method of claim 1, wherein the mask insulating layer is a silicon nitride layer.

8. The method of claim 1, wherein patterning the mask insulating layer and the isolation insulating film comprises:
forming a photoresist pattern on the mask insulating layer;
dry etching the mask insulating layer and the isolation insulating film, using the photoresist pattern as a mask; and
removing the photoresist pattern.

9. The method of claim 1, wherein forming an epitaxial silicon layer comprises:
removing the isolation insulating layer remaining in the active area; and
forming the epitaxial silicon layer in the active area by selective epitaxial growth (SEG), using the isolation insulating film and the junction blocking insulating film as masks.

10. The method of claim 9, wherein the forming of the epitaxial silicon layer in the active area uses the substrate in the active area as a source for SEG.

11. The method of claim 9, wherein the forming of the epitaxial silicon layer in the active area comprises:
growing the epitaxial silicon layer thicker than the isolation insulating layer; and
planarizing the epitaxial silicon layer to a top surface of the isolation insulating film.

12. The method of claim 11, wherein the planarization process is performed, using chemical mechanical polishing (CMP).

13. The method of claim 11, wherein the planarization process is performed, using the isolation insulating film as a polishing stopper.

14. The method of claim 1, wherein forming the gate stack comprises:
forming a gate dielectric layer on the epitaxial silicon layer;
forming a gate conductive layer on the gate dielectric layer; and
forming a gate pattern on the gate conductive layer so that a portion of the epitaxial silicon layer on the junction blocking insulating film is disposed under approximately the center of the gate stack in the active area.

15. The method of claim 14, wherein the gate dielectric layer is one of a silicon oxide layer and an oxynitride layer.

16. The method of claim 14, wherein the gate conductive layer comprises at least one of doped polysilicon and metal silicide.

17. The method of claim 14, further comprising, after the gate pattern is formed, forming insulating spacers on sidewalls of the gate conductive layer.

18. The method of claim 1, wherein forming the source and drain junctions comprises:
doping junction ions, using the gate stack as a mask; and
diffusing the junction ions, using a predetermined thermal process.

19. The method of claim 18, wherein the junction ions are P-type impurity or N-type impurity.

20. The method of claim 19, wherein the P-type impurity is boron (B) or BF2.

21. The method of claim 19, wherein the N-type impurity is phosphorus (P), arsenic (As), or antimony.

22. A method for manufacturing a semiconductor device, the method comprising:
forming an isolation structure that defines an active area;
forming a junction blocking insulating film in the active area, on a semiconductor substrate wherein the top of the junction blocking insulating film is substantially below the top of the isolation structure; and
forming an epitaxial silicon layer in the active area such that the junction blocking insulating film is buried in the epitaxial silicon layer,
wherein forming the isolation structure comprises:
forming an isolation insulating film on the semiconductor substrate;
removing a portion of the isolation insulating film to a predetermined depth;
forming a mask insulating layer on the isolation insulating film; and
patterning the mask insulating layer and the isolation insulating film.

23. The method of claim 22, further comprising:
forming a gate stack on the epitaxial silicon layer, and
forming source and drain junctions in the epitaxial silicon layer.

* * * * *